(12) United States Patent
Littau et al.

(10) Patent No.: US 7,110,099 B2
(45) Date of Patent: Sep. 19, 2006

(54) DETERMINATION OF CENTER OF FOCUS BY CROSS-SECTION ANALYSIS

(75) Inventors: Michael E. Littau, Albuquerque, NM (US); Christopher J. Raymond, Albuquerque, NM (US)

(73) Assignee: Accent Optical Technologies, Inc., Bend, OR (US)

( * ) Notice: Subject to any disclaimer, the term of this patent is extended or adjusted under 35 U.S.C. 154(b) by 333 days.

(21) Appl. No.: 10/492,111

(22) PCT Filed: Oct. 10, 2002

(86) PCT No.: PCT/US02/32394

§ 371 (c)(1),
(2), (4) Date: Apr. 8, 2004

(87) PCT Pub. No.: WO03/032085

PCT Pub. Date: Apr. 17, 2003

(65) Prior Publication Data

US 2004/0223137 A1      Nov. 11, 2004

Related U.S. Application Data

(60) Provisional application No. 60/328,576, filed on Oct. 10, 2001.

(51) Int. Cl.
*G01B 9/00* (2006.01)

(52) U.S. Cl. .................................................... 356/124

(58) Field of Classification Search ................ 356/124, 356/401, 400, 399; 355/53, 77; 250/548
See application file for complete search history.

(56) References Cited

U.S. PATENT DOCUMENTS 3,677,651 A    7/1972   Herriott et al.

(Continued)

FOREIGN PATENT DOCUMENTS

WO        WO 01/97279 A2    12/2001

OTHER PUBLICATIONS

Allgair, J., et al., "Implementation of Spectroscopic Critical Dimension (SCD™) for Gate CD Control and Stepper Characterization", *Metrology, Inspection, and Porcess control for Microlithography XV, Proceedings of SPIE*, 2001, pp. 462-471, vol. 4344, SPIE.

(Continued)

*Primary Examiner*—Hoa Q. Pham
*Assistant Examiner*—Tri Ton
(74) *Attorney, Agent, or Firm*—Stephen A. Slusher; Philip D. Askenazy; Peacock Myers, P.C.

(57) ABSTRACT

Methods for determination of parameters in lithographic devices and applications by cross-section analysis of scatterometry models, including determination of center of focus in lithography devices and applications. Control methods are provided for process control of center of focus in lithography devices utilizing cross-section analysis.

62 Claims, 6 Drawing Sheets

U.S. PATENT DOCUMENTS

| | | |
|---|---|---|
| 3,849,643 A | 11/1974 | Takeda |
| 3,856,407 A | 12/1974 | Takeda et al. |
| 4,493,555 A | 1/1985 | Reynolds |
| 4,615,621 A | 10/1986 | Allen et al. |
| 4,645,338 A | 2/1987 | Juliana, Jr. et al. |
| 4,705,940 A | 11/1987 | Kohno |
| 4,710,642 A | 12/1987 | McNeil |
| 4,800,547 A | 1/1989 | Kessels et al. |
| 5,164,790 A | 11/1992 | McNeil et al. |
| 5,191,200 A | 3/1993 | van der Werf et al. |
| 5,218,193 A | 6/1993 | Miyatake |
| 5,241,369 A | 8/1993 | McNeil et al. |
| 5,300,786 A | 4/1994 | Brunner et al. |
| 5,408,083 A | 4/1995 | Hirukawa et al. |
| 5,635,722 A | 6/1997 | Wakamoto et al. |
| 5,673,208 A | 9/1997 | Meier et al. |
| 5,675,140 A | 10/1997 | Kim |
| 5,703,692 A | 12/1997 | McNeil et al. |
| 5,712,707 A | 1/1998 | Ausschnitt et al. |
| 5,770,338 A | 6/1998 | Lim et al. |
| 5,867,276 A | 2/1999 | McNeil et al. |
| 5,880,838 A | 3/1999 | Marx et al. |
| 5,884,242 A | 3/1999 | Meier et al. |
| 5,889,593 A | 3/1999 | Bareket |
| 5,912,741 A | 6/1999 | Carter et al. |
| 5,936,738 A | 8/1999 | Liebmann et al. |
| 5,952,132 A | 9/1999 | King et al. |
| 5,953,128 A | 9/1999 | Ausschnitt et al. |
| 5,963,329 A | 10/1999 | Conrad et al. |
| 5,991,004 A | 11/1999 | Wallace et al. |
| 6,005,666 A | 12/1999 | Dandliker et al. |
| 6,063,531 A | 5/2000 | Singh et al. |
| 6,088,113 A | 7/2000 | Kim |
| 6,091,075 A | 7/2000 | Shibata et al. |
| 6,100,985 A | 8/2000 | Scheiner et al. |
| 6,151,115 A | 11/2000 | Naulleau |
| 6,172,757 B1 | 1/2001 | Lee |
| 6,259,521 B1 | 7/2001 | Miller et al. |
| RE37,359 E | 9/2001 | Wakamoto et al. |
| 6,297,879 B1 | 10/2001 | Yang et al. |
| 6,429,930 B1 | 8/2002 | Littau et al. |
| 2001/0023918 A1 | 9/2001 | Kondo |
| 2002/0033945 A1 | 3/2002 | Xu et al. |
| 2002/0038196 A1 | 3/2002 | Johnson et al. |
| 2002/0041008 A1 | 4/2002 | Krukar et al. |
| 2002/0041373 A1* | 4/2002 | Littau et al. ................. 356/124 |
| 2002/0051564 A1 | 5/2002 | Benesch et al. |
| 2002/0090744 A1 | 7/2002 | Brill et al. |
| 2002/0109828 A1* | 8/2002 | Moors et al. ................. 355/76 |
| 2002/0128784 A1 | 9/2002 | Scheiner et al. |
| 2002/0131055 A1 | 9/2002 | Niu et al. |
| 2002/0135781 A1 | 9/2002 | Singh et al. |
| 2002/0135783 A1 | 9/2002 | Opsal et al. |

OTHER PUBLICATIONS

Ausschnitt, C.P., et al., "Seeing the forest for the trees: a new approach to CD Control", *SPIE*, pp. 212-220, vol. 3332.

Edwards, R., et al., Characterization of Autofocus Uniformity and Precision on ASML, Steppers using the Phase Shift Focus Monitor Reticle, *SPIE*, pp. 448-455, vol. 3051.

* cited by examiner

DETERMINATION OF CENTER OF FOCUS BY CROSS-SECTION ANALYSIS

CROSS-REFERENCE TO RELATED APPLICATIONS

This application claims the benefit of the filing of U.S. Provisional Patent Application Ser. No. 60/328,576, entitled Determination Of Center Of Focus By Cross-Section Area Analysis Of Scatterometric Models And Diffraction Signature Variance, filed on Oct. 10, 2001, and the specification thereof is incorporated herein by reference.

BACKGROUND OF THE INVENTION

1. Field of the Invention (Technical Field)

The present invention relates to methods for determination of parameters in lithography applications by cross-section scatterometry model analysis, including determination of center of focus in lithography applications, such as for photoresist lithographic wafer processing.

2. Background Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

Lithography has a variety of useful applications in the semiconductor, optics and related industries. Lithography is used to manufacture semiconductor devices, such as integrated circuits created on wafers, as well as flat-panel displays, disk heads and the like. In one application, lithography is used to transmit a pattern on a mask or reticle to a resist layer on a substrate through spatially modulated light. The resist layer is then developed and the exposed pattern is either etched away (positive resist) or remains (negative resist) to form a three dimensional image pattern in the resist layer. However, other forms of lithography are employed in addition to photoresist litholography.

In one form of lithography, particularly used in the semiconductor industry, a wafer stepper is employed, which typically includes a reduction lens and illuminator, an excimer laser light source, a wafer stage, a reticle stage, wafer cassettes and an operator workstation. Modern stepper devices employ both positive and negative resist methods, and utilize either the original step-and-repeat format or a step-and-scan format, or both.

Exposure and focus determine the quality of the image pattern that is developed, such as in the resist layer utilizing photoresist lithography. Exposure determines the average energy of the image per unit area and is set by the illumination time and intensity. Focus determines the decrease in modulation relative to the in-focus image. Focus is set by the position of the surface of the resist layer relative to the focal plane of the imaging system.

Local variations of exposure and focus can be caused by variations in the resist layer thickness, substrate topography, and stepper focus drift. Because of possible variations in exposure and focus, image patterns generated through lithography require monitoring to determine if the patterns are within an acceptable tolerance range. Focus and exposure controls are particularly important where the lithographic process is being used to generate sub-micron lines.

A variety of methods and devices have been used to determine focus of stepper and similar lithography devices. Scanning electron microscopes (SEM) and similar devices are employed. However, while SEM metrology can resolve features on the order of 0.1 microns, the process is costly, requires a high vacuum chamber, is relatively slow in operation and is difficult to automate. Optical microscopes can be employed, but do not have the required resolving power for sub-micron structures. Other methods include the development of specialized targets and test masks, such as are disclosed in U.S. Pat. Nos. 5,712,707, 5,953,128, and 6,088,113. Overlay error methods are also known, as disclosed in U.S. Pat. No. 5,952,132. However, these methods, while increasing resolution because of the nature of the targets, still require use of SEM, optical microscopes or similar direct measurement devices.

A variety of scatterometer and related devices and measurements have been used for characterizing the microstructure of microelectronic and optoelectronic semiconductor materials, computer hard disks, optical disks, finely polished optical components, and other materials having lateral dimensions in the range of tens of microns to less than one-tenth micron. For example, the CDS200 Scatterometer, made and sold by Accent Optical Technologies, Inc. is a fully automated nondestructive critical dimension (CD) measurement and cross-section profile analysis system, partially disclosed in U.S. Pat. No. 5,703,692. This device can repeatably resolve critical dimensions of less than 1 nm while simultaneously determining the cross-sectional profile and performing a layer thickness assessment. This device monitors the intensity of a single diffraction order as a function of the angle of incidence of the illuminating light beam. The intensity variation of the $0^{th}$ or specular order as well as higher diffraction orders from the sample can be monitored in this manner, and this provides information that is useful for determining the properties of the sample target which is illuminated. Because the process used to fabricate the sample target determines the properties of a sample target, the information is also useful as an indirect monitor of the process. This methodology is described in the literature of semiconductor processing. A number of methods and devices for scatterometer analysis are taught, including those set forth in U.S. Pat. Nos. 4,710,642, 5,164,790, 5,241,369, 5,703,692, 5,867,276, 5,889,593, 5,912,741, and 6,100,985.

Another technique to determine best focus uses a specially designed reticle based upon phase shift technology (R. Edwards, P. Ackmann, C. Fischer, "Characterization of Autofocus Uniformity and Precision on ASML Steppers using the Phase Shift Focus Monitor Reticle," *Proc. SPIE Vol.* 3051, pp. 448–455, 1997). As the features are shot further away from best focus, the images printed from the reticle become more asymmetric and have more lateral image displacement. These images can be analyzed using image-based metrology tools, such as those used for overlay measurements.

Another technique to determine best focus is the line-shortening technique, also known as 'schnitzlometry' (C. P. Ausschnitt, M. E. Lagus, "Seeing the forest for the trees: a new approach to CD control," *Proc. SPIE Vol.* 3332, pp. 212–220, 1998). The method uses relatively large CD (~3 microns) line/space arrays, where two arrays are placed next to each other. As the structures are printed through focus and/or dose, the lines themselves shorten and the space between the arrays broadens. This space can be measured using image-based metrology tools such as those used for overlay measurements.

Another technique to determine best focus is the Diffraction Signature Difference, or DSD, technique, as disclosed in U.S. Pat. No. 6,429,930 to Michael E. Littau and Christopher J. Raymond, Determination of Center of Focus by Diffraction Signature Analysis. This technique uses an empirical analysis of scatterometry diffraction signatures. As best focus is reached, the difference between diffraction signatures between adjacent focus steps will minimize.

One of the more widely used techniques for determination of best focus is the so-called "Bossung plot" method. When a CD metrology tool such as a CD-SEM or scatterometer measures CD on a selected feature printed through focus, the resulting trend is usually parabolic. Fitting a parabolic curve to the CD trend and determining where the slope of the curve is zero identifies best focus. These curves are known as Bossung plots. One advantage to the Bossung method is that the actual CD of the process is quantified in addition to the best focus condition. However, the method is not always robust for certain process conditions which makes it difficult to determine best focus and difficult to implement in an automated manner. Furthermore, when the method is used with a CD-SEM, the measurement may be influenced by changes to the sidewall angle of the lines and hence produce a biased result.

Scatterometers and related devices can employ a variety of different methods of operation. In one method, a single, known wave-length source is used, and the incident angle $\Theta$ is varied over a determined continuous range. In another method, a number of laser beam sources are employed, optionally each at a different incident angle $\Theta$. In yet another method, an incident broad spectral light source is used, with the incident light illuminated from some range of wavelengths and the incident angle $\Theta$ optionally held constant. Variable phase light components are also known, utilizing optics and filters to produce a range of incident phases, with a detector for detecting the resulting diffracted phase. It is also possible to employ variable polarization state light components, utilizing optics and filters to vary the light polarization from the S to P components. It is also possible to adjust the incident angle over a range $\phi$, such that the light or other radiation source rotates about the target area, or alternatively the target is rotated relative to the light or other radiation source. Utilizing any of these various devices, and combinations or permutations thereof, it is possible and known to obtain a diffraction signature for a sample target.

Besides scatterometer devices, there are other devices and methods capable of determining the diffraction signatures at the $0^{th}$ order or higher diffraction orders using a light-based source that can be reflected off of or transmitted through a diffraction grating, with the light captured by a detector. These other devices and methods include ellipsometers and reflectometers, in addition to scatterometers. It is further known that non-light-based diffraction signatures may be obtained, using other radiation sources as, for example, X-rays.

A variety of sample targets are known in the art. A simple and commonly used target is a diffraction grating, essentially a series of periodic lines, typically with a width to space ratio of between about 1:1 and 1:3, though other ratios are known. A typical diffraction grating, at for example a 1:3 ratio, would have a 100 nm line width and a 300 nm space, for a total pitch (width plus space) of 400 nm. The width and pitch is a function of the resolution of the lithographic process, and thus as lithographic processes permit smaller widths and pitches, the width and pitch may similarly be reduced. Diffraction techniques can be employed with any feasible width and pitch, including widths and/or pitches substantially smaller than those now typically employed. Bi-periodic and other multi-periodic structures are also known, such as those disclosed in U.S. Patent Application Publication No. US 2002/0131055, published Sep. 19, 2002. Three-dimensional gratings or structures are also known, including those disclosed in U.S. Pat. No. 6,429,930. Thus diffracting structures may possess more than one period, or may be made up of elements other than lines and spaces, such as holes, squares, posts or the like.

Diffraction gratings are typically dispersed, in a known pattern, within dies on a wafer. It is known in the art to employ multiple dies (or exposure fields) on a single wafer. Each diffraction pattern may be made by lithographic means to be at a different focus, such as by employing a different focus setting or a different exposure setting or dose. It is also known that center of focus may be determined using scatterometry and diffraction gratings by comparing diffraction signatures from a variety of different focus diffraction gratings to a theoretical model library of diffraction grating signatures yielding information regarding CD. The actual diffraction measures are compared to the model, from which CD values are derived. The CD value thus obtained is plotted against focus and the results fit to a parabolic curve. This Bossung plot method, discussed above, has significant inherent limitations.

SUMMARY OF THE INVENTION
(DISCLOSURE OF THE INVENTION)

In one embodiment, the invention provides a method of measuring parameters relating to a lithography device, the method including the steps of providing a substrate including a plurality of diffraction structures formed on the substrate by lithographic process utilizing the lithography device, the diffraction structures including a plurality of spaced elements; measuring a diffraction signature for at least three of the plurality of diffraction structures by means of a radiation source-based tool; selecting a theoretical diffraction structure providing a theoretical diffraction signature matching the measured diffraction signature of measured diffraction structures; calculating a cross-section of each selected theoretical diffraction structure; and determining a metric between the calculated cross-sections to determine a desired parameter of said lithography device. In this and other methods of the invention, the diffraction structures can be single period, bi-periodic or multi-periodic structures. The cross-section can be a cross-section area, a cross-section volume, or a product of two or more parameters of the theoretical diffraction structure providing the matching theoretical diffraction signature. In one embodiment, one parameter is CD.

In the methods of this invention, selecting a theoretical diffraction structure matching the measured diffraction signature of measured diffraction structures can include generating a theoretical library of theoretical diffraction signatures derived from theoretical diffraction structures. It can further include determining a best match theoretical diffraction signature from the theoretical library. The metric can include plotting the calculated cross-sections or determining the differences between calculated cross-sections.

In another embodiment, the invention provides a method of determining the center of focus in a lithography device, the method including the steps of providing a substrate including a plurality of diffraction structures made utilizing the lithography device, the plurality of diffraction structures including different known focus settings; measuring a diffraction signature for at least three of the plurality of diffraction structures by means of a radiation source-based tool; providing a theoretical library of theoretical diffraction signature of theoretical diffraction structures; determining a best match theoretical diffraction signature to each measured diffraction signature; calculating a cross-section for each theoretical diffraction structure providing a best match theoretical diffraction signature; and determining the center of focus as the focus setting wherein there is a minimal difference between the cross-section of adjacent focus setting diffraction gratings. In this method, the difference in cross-section between adjacent focus setting diffraction structures varies as an approximation of a parabolic curve with a slope of zero on the minimal difference. Determining the minimal difference can include fitting data derived from differences between cross-sections between adjacent sequential focus setting diffraction gratings to a parabolic curve, whereby the minimal difference encompasses the minima of the parabolic curve. In these methods, the cross-section of different focus setting diffraction structures can be plotted as a function of focus.

The methods of this invention further provide for process control for center of focus in a lithography device, the method including the steps of providing a substrate including a plurality of latent image diffraction structures made utilizing the lithography device, the plurality of diffraction structures including different known focus settings; measuring a diffraction signature for at least three of the plurality of latent image diffraction structures by means of a radiation source-based tool; providing a theoretical library of theoretical diffraction signatures of theoretical diffraction structures; determining a best match theoretical diffraction signature to each measured diffraction signature; calculating a cross-section for each theoretical diffraction structure providing a best match theoretical diffraction signature; determining the center of focus as the focus setting wherein there is a minimal difference between the cross-section of adjacent focus setting latent image diffraction structures; and adjusting the focus setting of the lithography device to the determined center of focus. In this method, adjusting the focus setting of the lithography device can include a computer-based control system. Adjusting the focus setting of the lithography device can include an autofocus control system, wherein at least one input to the autofocus control system includes a parameter relating to the differences between the cross-sections.

In all of the foregoing methods, the radiation source-based tool includes light source-based tools. In one embodiment, the light source-based tool includes an incident laser beam source, an optical system focusing the laser beam and scanning through some range of incident angles, and a detector for detecting the resulting diffraction signature over the resulting measurement angles. The light source-based tool can further include an angle-resolved scatterometer. In a different embodiment, the light source-based tool includes a plurality of laser beam sources. In yet another embodiment, the light source-based tool includes an incident broad spectral light source, an optical system focusing the light and illuminating through some range of incident wavelengths, and a detector for detecting the resulting diffraction signature over the resulting measurement wavelengths. In yet another embodiment, the light source-based tool includes an incident light source, components for varying the amplitude and phase of the S and P polarizations, an optical system focusing the light and illuminating over some range of incident phases, and a detector for detecting the phase of the resulting diffraction signature.

In all of the foregoing methods, measuring a diffraction signature includes phase measurement by means of a broad spectral radiation source-based tool source, operating at a fixed angle, a variable angle $\Theta$ or a variable angle $\phi$. In the methods, measuring a diffraction signature also includes phase measurement by means of a single wavelength radiation source-based tool source, operating at a fixed angle, a variable angle $\Theta$ or a variable angle $\phi$. Measuring a diffraction signature can also include phase measurement by means of a multiple discrete wavelength radiation source-based tool source or a broad spectral source-based tool source. The diffraction signature can be a reflective diffraction signature or a transmissive diffraction signature. The diffraction signature can be a specular order diffraction signature or a higher order diffraction signature, either positive or negative.

A primary object of the present invention is to provide a method for measuring parameters relating to a lithography device without the use of optical, SEM or similar microscopy metrology tools.

Another object of the present invention is to provide a method for determining center of focus of a lithography device by analyzing a cross-section of the best match theoretical diffraction signature of a series of different focus diffraction structures, including diffraction gratings, and utilizing the cross-sections to determine center of focus.

Another object of the present invention is to provide a method for determining or measuring parameters associated with a lithography device, including center of focus, by obtaining a diffraction signature utilizing either reflective or transmissive diffraction, comparing such diffraction signature to a library of theoretical models thereof, selecting a best match theoretical diffraction signature, and determining a cross-section of the theoretical diffraction structure yielding the best match theoretical diffraction signature.

Another object of the present invention is to provide a method for determining or measuring parameters associated with a lithography device, including center of focus, by obtaining a diffraction signature utilizing any method to create a diffraction signature, including but not limited to reflective or transmissive angle-resolved, variable wavelength, variable phase, variable polarization state or variable orientation diffraction, or a combination thereof, of the $0^{th}$ or specular diffraction order or any higher orders.

Another object of the present invention is to provide a method for determining or measuring parameters associated with a lithography device by means of any order of diffraction signature of different focus repeating or periodic diffraction structures, including the $0^{th}$ or specular order or any higher order diffraction, either positive or negative.

A primary advantage of the present invention is that it permits measuring parameters relating to a lithography device without the use of optical, SEM or similar microscopy metrology tools.

Another advantage of the present invention is that it permits use of a series of different focus diffraction structures or gratings on a conventional wafer made by means of a stepper, including conventional photoresist lithography means, to determine center of focus utilizing determination of diffraction signatures of repeating or periodic structures, or gratings, determination of a cross-section of the structure by means of a theoretical model, and plotting the cross-section or a derivative thereof as a function of focus.

Another advantage of the present invention is that it provides a method and device that permits obtaining results, including center of focus, in a lithography device, such as a stepper, in a shorter period of time and at lower cost than conventional and known methods.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIGS. 1A to 1C is an exploded schematic representation of a wafer with dies thereon, the dies including diffraction gratings, wherein FIG. 1A depicts the wafer, FIG. 1B depicts a die including a diffraction grating set on the wafer of FIG. 1A, and FIG. 1C depicts an individual diffraction grating on the die diffraction grating set of FIG. 1B;

DESCRIPTION OF THE PREFERRED EMBODIMENTS BEST MODES FOR CARRYING OUT THE INVENTION

The present invention provides methods and devices for measuring parameters relating to a lithography device, and in a preferred embodiment, for determining the center of focus of a lithography device. Determination of the center of focus for a fixed dose during the photoresist development step in wafer processing is critical. Furthermore, dose variations can compound the difficulty in determining this center. The lenses that are used in steppers have a very limited depth of focus, so utmost precision is necessary. Lenses that are in focus will yield sharper printed photoresist images, and lack of focus will result in misdeveloped photoresist features, and generally poorer process yields. Being at the center of focus, or best focus, improves process repeatability and stability.

Before proceeding to further describe the invention, the following definitions are given.

A lithography device refers to any device that utilizes an image, such as a mask, to transfer a pattern to and optionally into a substrate. This thus includes conventional optical lithography, such as photoresist lithography, but also includes other methods of lithography. In photoresist lithography, also called photolithography, optical methods are used to transfer circuit patterns from master images, called masks or reticles, to wafers. In this process, one or more specialized materials called resists are coated on the wafers on which the circuits are to be made. A resist coat is applied as required, and as required the wafer is further processed, such as by a softbake. Either positive or negative photoresist materials may be employed. Positive resists are normally insoluble in chemicals used as resist developers, but become soluble by exposure to light. Negative resists are normally soluble in chemicals used as resist developers, but become insoluble by exposure to light. By exposing the resist selectively in some areas but not others, the pattern of the circuit or other structure is created in the resist film. In optical lithography, the selective exposure is accomplished by imaging of a mask, typically by shining light onto the mask and projecting the transmitted image onto the resist film.

The lithography devices referenced in this invention include steppers, also known as wafer steppers, which are used to project the image of a circuit or other structure from a photomask onto a resist-coated wafer. A stepper typically includes reduction lens and illuminator, excimer laser light source, wafer stage, reticle stage, wafer cassettes and an operator workstation. Steppers employ both positive and negative resist methods, and utilize either a step-and-repeat format or a step-and-scan format, or combination thereof.

Figure 1:
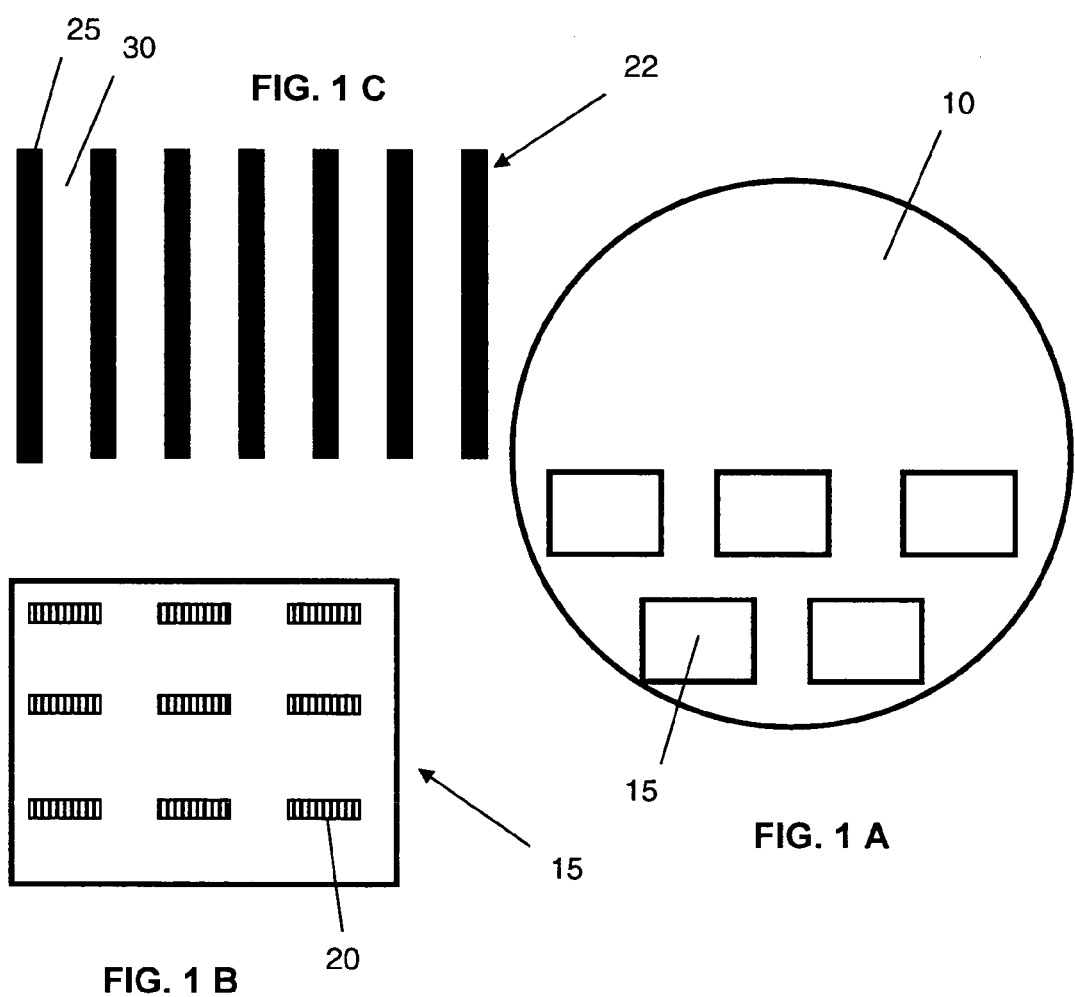
Figure 3:
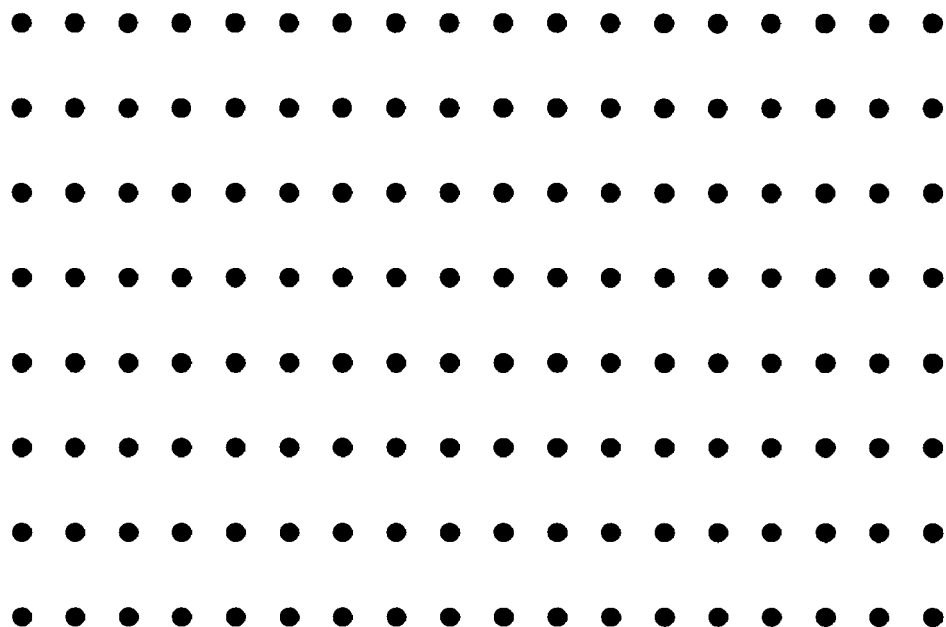
FIG. 3 depicts a three-dimensional diffraction structure.

There is employed in the practice of this invention a wafer or other substrate on which is posited a series of diffraction structures by means of a lithographic device. In its simplest terms, a diffraction structure is any structure or image made by lithographic means which generates a periodic variation of the refractive index relative to an incident illumination. This change in refractive index can be either due to a physical difference or a chemical difference. Physical differences include photoresist or other lithographically generated changes, such as utilizing a material with one refractive index coupled with air, such as ordinary scored optical diffraction gratings, or a material coupled with a different material. Chemical differences include wafers with photoresist exposed diffraction structures, such as gratings, where the resist has not yet been developed. In this case all of the resist is still present, but the portions that have been exposed have a different refractive index than the non-exposed resist portions, thereby creating a diffraction structure consisting of periodic variations of refractive index in the resist. The periodic difference is obtained by the periodicity of structural or chemical elements. A diffraction structure may have a single period, may be bi-periodic, or may be multi-periodic. This thus includes conventional diffraction gratings consisting of a series of parallel lines, but also includes structures such as a three-dimensional array of posts or holes, wherein there is periodicity in both in the X direction and Y direction. A diffraction structure with periodicity in both the X and Y directions is shown in FIG. 3, and a diffraction structure with periodicity in one direction, consisting of parallel lines 25, is shown in FIG. 1C. Diffraction structures thus include photoresist gratings, etched film stack gratings, metal gratings and other gratings known in the art. A diffraction grating typically has a line width to space ratio of between about 1:1 to 1:3, though other ratios may be employed. A typical diffraction grating, at for example a 1:3 ratio, could have a 100 nm line width and a pitch of 400 nm. The width and pitch can be significantly smaller, depending in part on the resolution of the lithographic device.

Figure 2:
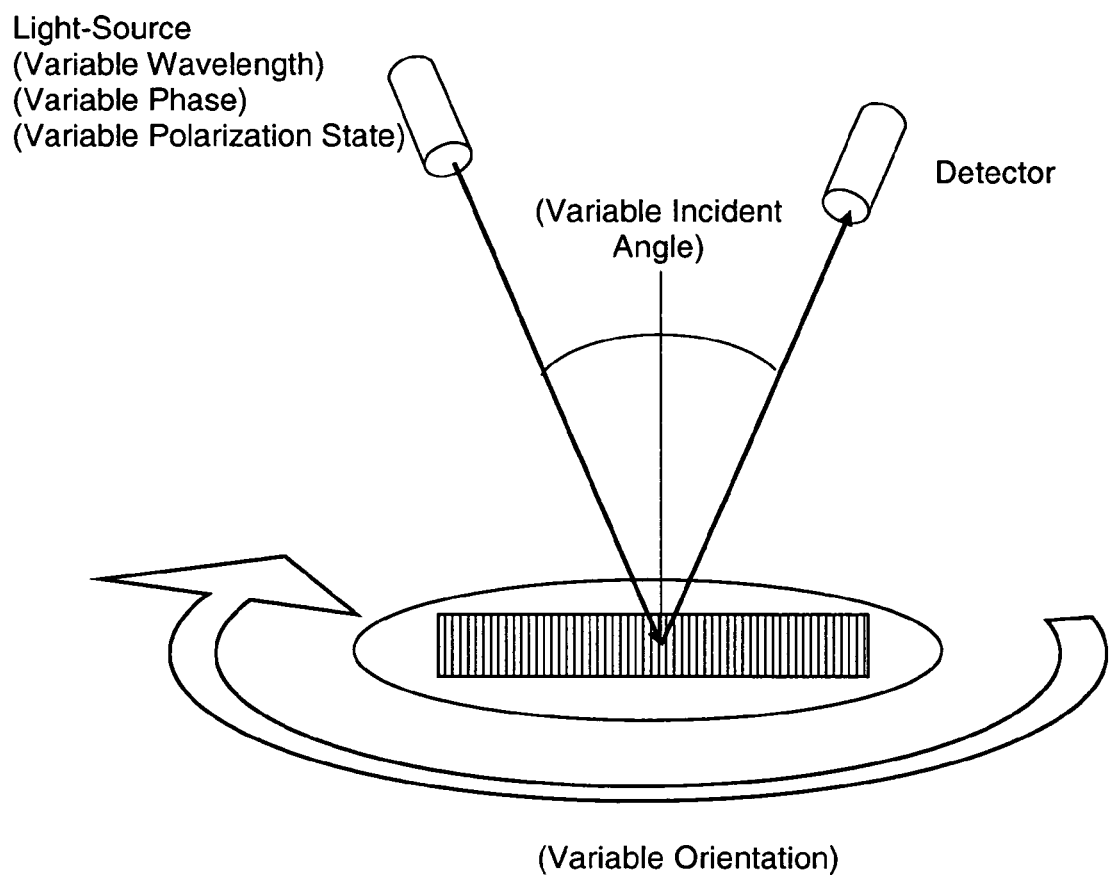
FIG. 2 is a schematic representation of various modes of obtaining a reflective $0^{th}$ order diffraction signature.

In the practice of this invention, a diffraction structure is used to generate a diffraction signature. A diffraction signature can be generated by any of a number of instruments, such as scatterometers, ellipsometers or reflectometers. Any device employing radiation to generate a diffraction signature is referred to herein as a radiation source-based tool Typically a visible radiation source-based tool, such as a light source-based tool, is employed, but the radiation source may be other than visible radiation, such as an X-ray source. In one embodiment, the diffraction signature is created by a reflective mode, wherein the radiation, such as light, is reflected. Thus a diffraction signature may be generated by means of an angle-resolved scatterometer, wherein a single known wave-length source is used, and the incident angle Θ is varied over a determined continuous range, as shown in FIG. 2. The resulting diffraction signature can be depicted as the intensity of light plotted against the incident and reflective angle Θ. In another method, a number of laser beam sources are employed, optionally each at a different incident angle Θ. In yet another method, an incident broad spectral light source is used, with the incident light illuminated from some range of wavelengths and the incident angle Θ optionally held constant, as is shown in FIG. 2. Variable phase light sources are also known, utilizing a range of incident phases, with a detector for detecting the resulting diffracted phase, as is shown in FIG. 2. Variable polarization light sources are also known, utilizing a range of polarization from the S to P components or the P to S components. It is also possible to adjust the incident angle over a range $\phi$, such that the light source rotates about the diffraction structure, or alternatively the diffraction structure is rotated relative to the light source, as shown in FIG. 2. Utilizing any of these various devices, and combinations or permutations thereof, it is possible and known to obtain a diffraction signature for a given diffraction structure. In general, the detected light intensity can be plotted against the at least one variable parameter, such as angle of incidence Θ, wavelength of incident light, phase of incident light, angle of sweep $\phi$ or the like. The diffraction signature may represent the $0^{th}$ or specular diffraction order, or may represent any higher diffraction order. It is also possible and contemplated that a transmissive mode may be employed to generate a diffraction signature, such as by use of an X-ray radiation source as a component of the radiation source-based tool.

In the practice of the invention, a theoretical library of diffraction structures and corresponding theoretical diffraction signatures is generated, and theoretical diffraction signatures based on the theoretical diffraction structures are compared to the measured diffraction signature. This may be done by any number of different methods. In one approach, an actual library of theoretical output signals are generated, based on assigned parameters for variables. This library may be generated prior to actual measurement of a diffraction signature or may be generated in a process of matching the measured diffraction signature to a theoretical diffraction signature. Thus as used herein a theoretical library includes both a library generated independent of the measured diffraction signature and a library generated based on a theoretical "best guess" of the geometry of the measured structure and calculation of the resulting theoretical diffraction signature, with iterative comparison to changed parameter structures to determine a best match. The theoretical library of diffraction signatures may also be generated empirically, such as by a collection of diffraction signatures of diffraction structures with dimensions measured by an alternative means. The library may optionally be pruned by removing signals that may be accurately represented via interpolation from other signals in the reference set. An index of the library can similarly be generated by correlating each signature with one or more indexing functions and then ordering the index based on the magnitude of the correlation. Construction or generation of libraries of this type, and methods for optimization thereof, are well known in the art. In one approach, a rigorous, theoretical model based on Maxwell's equations is employed to calculate a predicted optical signal characteristic of the diffraction structure, such as the diffraction signature, as a function of diffraction structure parameters. In this process, a set of trial values of the diffraction structure parameters is selected. Then, based on these values a computer-representable model of the diffraction structure, including its optical materials and geometry, is constructed. The electromagnetic interaction between the diffraction structure and illuminating radiation is numerically simulated to calculate a predicted diffraction signature. Any of a variety of fitting optimization algorithms may be employed to adjust the diffraction structure parameter values, with the process iteratively repeated to minimize discrepancy between the measured and predicted diffraction signature, thereby obtaining the best match. U.S. Published Patent Application No. US 2002/0046008 discloses one database method for structure identification, while U.S. Published Patent Application No. US 2002/0038196 discloses another method. Similarly, U.S. Published Patent Application No. US 2002/0135783 discloses a variety of theoretical library approaches, as does U.S. Published Patent Application No. US 2002/0038196. Diffraction structure parameters that may be utilized in a theoretical library include any parameter that may be modeled, including factors such as:

Critical dimensions (CDs) at the bottom and/or top of the structure

Height or thickness, such as height or thickness of a line, post or other structure Total height of the region defined by a diffraction signature Shape of a structure, such as rectangular, trapezoidal, triangular, round or other geometric shapes Radius of curvatures at the bottom and/or top of a structure or region Period of a grating Line or other structure width Materials parameters of the structure, including parameters of various layers thereof Materials parameters of the substrate on which a structure is posited, such as film thickness and index of refraction of films underneath the structure Various weighted or average values, such as CD at a specified location, values weighted by relative contributions of the structure and substrates, or the like In the practice of this invention, a cross-section of the theoretical diffraction structure that has the best match theoretical diffraction signature compared to the measured diffraction signature is calculated. A cross-section is, within the meaning of this invention, the product of at least two diffraction structure parameters of the best match structure. In one embodiment, the cross-section is a cross-section area, such as the product of CD and height. In another embodiment, the cross-section is a cross-section volume, such as the product of CD, height and shape of a structure. However, as used herein the cross-section need not be a geometrically defined shape; that is, the cross-section can be the product of any two or more diffraction structure parameters. In one embodiment, the cross-section includes CD and at least one additional diffraction structure parameter. As used herein, a product of at least two diffraction structure parameters is any mathematical operation or manipulation of the at least two parameters, including but not limited to a mathematical operation including multiplication, and optionally at least one second mathematical operation.

The best match or match of the cross-section of a theoretical diffraction signature to the measured diffraction signature can be calculated by any means known in the art. In one embodiment, it can include a match of the measured diffraction signature to discrete and existing theoretical diffraction signatures contained in an existing library, such as through use of various matching algorithms, whereby utilizing defined constraints a best match is selected. In another embodiment, a best match can include library interpolations to obtain a theoretical diffraction signature, even though such theoretical diffraction signature may not exist prior to interpolation. It can further include averaging and related models to report a theoretical diffraction signature based on sampling of theoretical diffraction signatures contained in a library. Thus any method or technique of identifying or matching a reported diffraction signature to a theoretical diffraction signature, however obtained, may be employed herein to determine a match or best match.

In one embodiment of the invention, a wafer 10 as in FIG. 1A is provided, on which is disposed a series of dies 15. Each die, as illustrated in FIG. 1B, typically represents that portion of the wafer representing the exposure field of the lithographic device, such as a stepper. In a step-and-repeat system, the entire area of the mask or reticle to be exposed is illuminated when the shutter is opened, thereby simultaneously exposing the entire die exposure field. In a step-and-scan system, only a part of the reticle or mask, and thus only a part of the die exposure field, is exposed when the shutter is opened. In either event, the reticle or mask may be moved such that a diffraction grating set 20 is produced, the diffraction grating set 20 being composed of a series of different, optionally different focus, diffraction gratings, with a diffraction grating 22 shown at FIG. 1C, which diffraction grating 22 forms a part of diffraction granting set 20. It is also possible that the diffraction grating set 20 is composed of a series of the same diffraction gratings, or is composed of a series of same focus but different dose diffraction gratings. In a preferred embodiment, the diffraction grating set 20 is composed of a series of different focus diffraction gratings, preferably varying by a known and incremental focus step, wherein all diffraction gratings are at a fixed dose. Diffraction grating 22 depicts an example of a diffraction grating forming a part of diffraction grating set 20. From die to die on a wafer 10, either the dose range or focus setting range, or both, may vary. Conventionally, the dose or focus is varied in constant incremental steps, thereby facilitating subsequent analysis. Thus the focus, for example, might vary in 50 to 100 nm steps over a determined range, and the dose, for example, might vary in 1 or 2 mJ increments over a determined range. Diffraction grating 22 may employ conventional lines 25 separated by spaces 30 as shown in FIG. 1C, or may be any other diffraction structure, including diffraction structures that employ a three-dimensional pattern, such as shown in FIG. 3.

The diffraction structures are typically created in a resist material by preparing masks with opaque and transparent areas corresponding to the desired shape, size and configuration of the desired diffraction structure. A source of radiation is then applied on one side of the mask, thereby projecting the mask shape and spaces onto the resist layer, the resist layer being on the opposite side of the mask. One or more lens or other optical systems may be interposed between the mask and the resist layer, and also optionally between the radiation source and the mask. When exposed to radiation or energized at sufficient levels to effect a change in the resist, a latent image is formed in the resist. The latent images, representing a chemical change in the resist material, result in changes in reflectivity of the resist layer, and thus may be employed to generate a diffraction signature as set forth above. In one embodiment, the wafer with latent images in the resist may be subjected to a post-exposure bake, used to drive additional chemical reactions or to diffuse components within the resist layer. In yet another embodiment, the resist may be developed by a development process, optionally a chemical development process, whereby a portion of the resist is removed, the portion determined by whether a positive resist or negative resist was employed. The development process is also referred to as an etching process, resulting in etched areas or spaces of the resist layer, and optionally the substrate material, such as other films, on which such resist layer is posited.

In the methods and devices of this invention, the diffraction structure may be exposed but not developed, or may alternatively be developed. Similarly, while the foregoing generally describes a conventional method of generating a diffraction structure, any method may be employed, including use of phase shift masks, any of a variety of sources of radiation, including electron beam exposure, and the like.

Focus is a critical parameter in any lithography device, including a stepper or similar lithography device. Focus and depth-of-focus are functions of dose, or quanta of radiation energy, and focus, or distance from the lens to the target. The resulting imaging must be good for all points within a given exposure field, thereby resulting in a definable usable depth-of-focus. However, factors other than dose and focus affect the focus and depth-of-focus, including astigmatism, field curvature, lens quality, orientation of the wafer stage in the x- and y-axes, and the like. Typical production wafer steppers have a resolution of from about 0.15 to about 1.25 microns, and a usable depth-of-focus of from about 0.40 to about 1.50 microns.

Determination of the center of focus for a fixed dose is thus critical in efficient operation of a lithography device, such as for a stepper during the photoresist exposure step in wafer processing. Dose variations compound the difficulty in determining this center. The lenses that are used in steppers and other lithographic devices have a very limited depth of focus, so utmost precision is necessary. Lenses that are in focus will yield sharply printed photoresist images, and lack of focus will result in non-functional photoresist features. Being at the center of focus also significantly improves process repeatability. Once the center of focus is known and determined, any of a variety of different autofocus systems or schemes may be employed for determining that the separation between the lens and the wafer is held constant. These systems include optical methods, such as employing reflected light, capacitance methods and pressure sensor methods, such as employing pressurized air. However, these systems and schemes are incapable of determining center of focus, but simply maintain the lens-to-wafer distance at a constant. In typical operations, the center of focus must be determined periodically, as often every six hours or less of operation of a lithography device.

In a preferred embodiment, the invention employs cross-section scatterometry model analysis to determine the center of focus for a stepper or scanner. First, a series of features varied over focus for a fixed dose is made by lithographic means. The features consist of repeating or periodic diffraction structures capable of diffracting radiation. Using a radiation source-based tool capable of scatterometric measurements, the series of diffraction structures is measured to obtain diffraction signatures for a fixed dose at each varied focus. The diffraction structures may either be two-dimensional, such as a conventional diffraction grating with lines and spaces, or three-dimensional, such as holes, posts or more complex structures. In the case of three-dimensional structures the selected cross-section of the structure may be the volume of the structure. The theoretical library, used to determine the cross-section, may employ a model with a simple shape such as a rectangle, or may employ more complex shapes such as a trapezoid, trapezoid with rounded edges, gaussian or sigmoidal profile or other custom profile designated by the user. The theoretical library may also take into account underlying films and patterns. The theoretically generated diffraction signatures, which have known parameters, are matched to the experimental data to obtain the theoretically predicted process parameters. Using these process parameters, a cross-section of the diffraction structure is calculated. More complex models can incorporate the optical properties of the diffraction structure, such as optical n and k values, as well as underlying film thicknesses, to make the focus metric a summation of the optical path.

To obtain best focus, the cross-section, as calculated from the best match theoretical model of the theoretical library, is plotted as a function of focus. The difference in area from one focus step to the next becomes less and less as the center of focus is approached. Under theoretically ideal conditions, the center of focus is the point at which variation in the cross-section between successive focus steps is at a minima. In another expression of this method, a parabolic curve can be used to fit the area response to focus, and the center of focus will be at a point where the slope of the parabolic curve is zero. Both "concave up" and "concave down" responses are possible, depending on the photoresist chemistry and processing, and therefore a minima or maxima of the parabolic curve is possible. In either case, the center of focus is at the point where the slope of the parabola is zero. As used herein, minima thus includes both a conventional maxima as well as a conventional minima. Various other statistical techniques can be used to calculate the center of focus from the area response to focus.

These techniques are applicable to metrology tools that have a radiation-based source that can be reflected off of or transmitted through a diffraction structure, and the radiation captured by a detector. In other words, any tool capable of diffraction-based scatterometry measurements can be used in this technique. This includes, but is not limited to, angle-resolved and/or wavelength-resolved tools using reflectometry or ellipsometry.

This technique can also be used to monitor focus and/or dose and/or layer thickness drifts in a production setting. While monitoring the calculated area of the diffraction structure, if the calculated area deviates beyond a specified range, the process may be checked for drift.

In use of these methods, it may be necessary to utilize various filters to remove outliers that may adversely affect the focus analysis. One such filter is the use of goodness of fit metric of the theoretical diffraction signature to the experimental diffraction signature. Matches with poor goodness of fits may be thrown out of the analysis.

The methods of this invention will find primary application with the photoresist processing step, as determination of best focus is of utmost importance for this step. However, the methods of this invention can also be applied further down the processing line, to determine the "best focus" setting for etched film stacks and metal gratings, or for the "best etch" conditions associated with the etch process.

Traditional Bossung plots plot CD as a function of focus to determine best focus. Additional parameters are known to be individually plotted as a function of focus to determine best focus, such as sidewall or thickness. J. A. Allgair, D. C. Benoit, R. R. Hershey, L. C. Lift, B. Braymer, P. P. Herrera, C. A. Mack, J. C. Robinson, U. K. Whitney, P. Zalicki, "Implementation of spectroscopic critical dimension (SCD) for gate CD control and stepper characterization," *Proc SPIE, Vol.* 4344, pp. 462–471, 2001. However, these parameters frequently do not have a parabolic response to focus. As discussed hereafter, the methods of this invention provide superior results.

Figure 5:
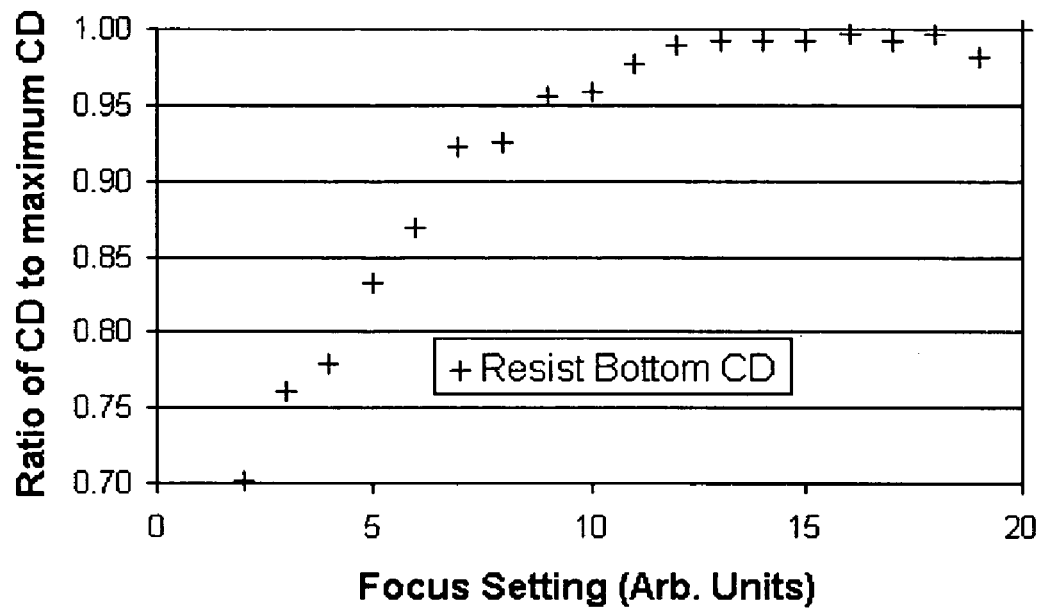
FIG. 5 is a graph that depicts sample resist bottom CD trending with focus.

FIG. 5 is a plot of a scatterometry-measured resist bottom CD response based upon experimental data as a function of focus. The bottom CD is expressed as a function of the ratio of the bottom CD to the maximum bottom CD seen in the focus trend. The trending of this Bossung plot is not parabolic. It rises through focus and then reaches a plateau.

Figure 6:
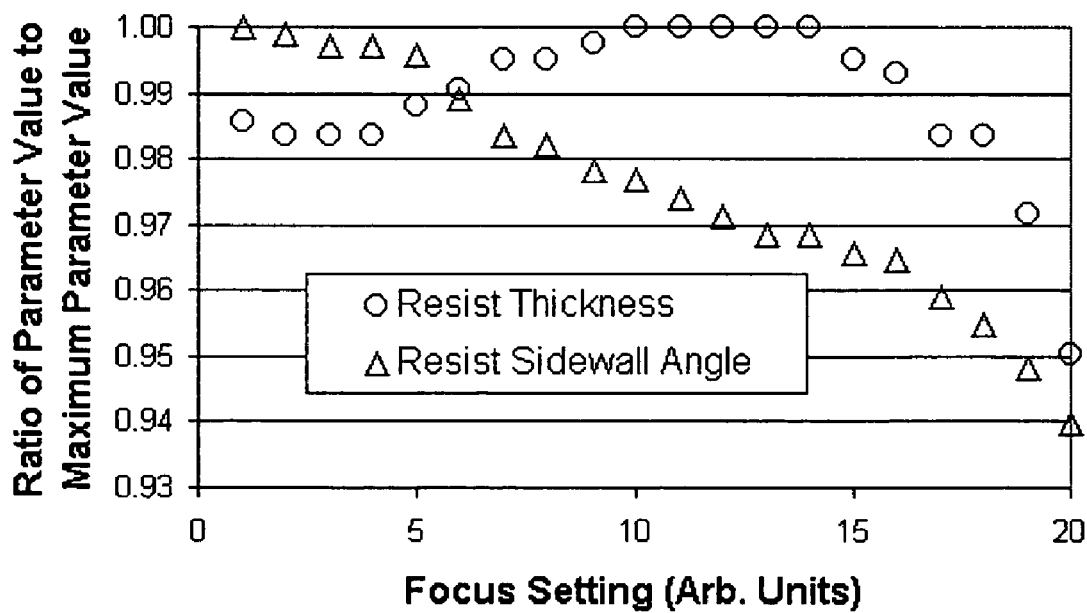
FIG. 6 is a graph that depicts sample resist sidewall and resist thickness trending with focus.

FIG. 6 is a plot of scatterometry-measured resist sidewall and resist thickness values as a function of focus. The sidewall and resist values are expressed as the ratio of the parameter to the parameter maximum in the focus trend. The sidewall trend is in general opposite of that of bottom CD. It is highest when bottom CD is lowest. The highest sidewall value can actually be greater than 90 degrees. Sidewall decreases as bottom CD increases. There is a point roughly halfway through the focus curve where the resist thickness is constant. Resist loss is seen near both edges of focus. It can be seen that the resist thickness is somewhat parabolic, but it will not always yield a robust curve, particularly for dense grating structures where resist loss can be minimized for a large area of focus.

Figure 7:
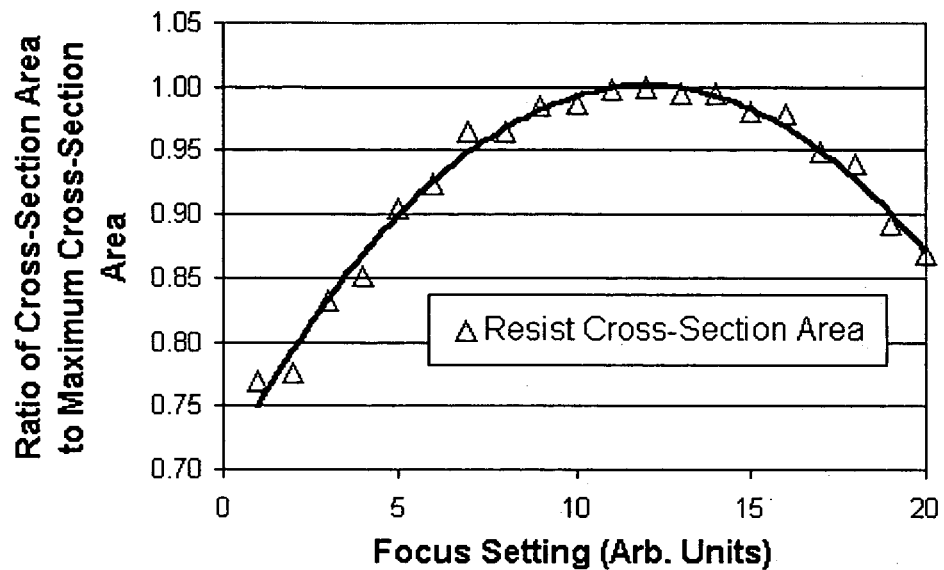
FIG. 7 is a graph that depicts sample resist cross-section area trending with focus.

FIG. 7 is a plot of the resist cross-section, here cross-section area, as a function of focus, determined by the methods of this invention. A simple resist trapezoid model was used. The cross-section area is expressed as the ratio of the cross-section area to the maximum cross-section area in the focus trend. The resist bottom CD, sidewall, and thickness do not yield a parabolic trend on their own as shown in FIGS. 5 and 6, but when combined together to form the grating cross-section area, a parabolic trend is seen, as shown in FIG. 7. Even when an individual parameter, such as CD or thickness, can be plotted against focus and yields a parabolic curve, a similar parabolic curve, in many cases with a better fit to the parabolic curve, can be found by using the cross-section. In addition, the cross-section need not be an area, and thus may be a volume or may be the product of two or more parameters that does not yield a geometric shape. Thus the cross-section may be an area, a volume or a product of two or more parameters. In one embodiment, CD is selected as one parameter.

Figure 8:
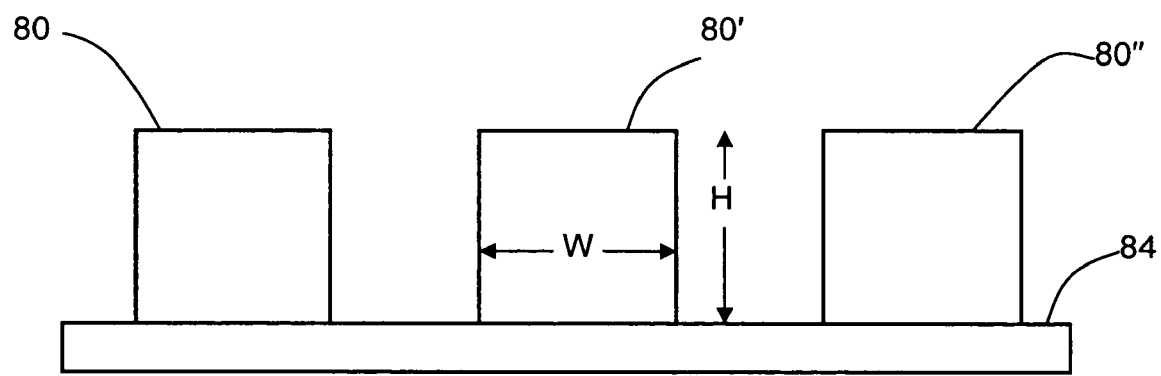
FIG. 8 depicts a cross-section of a rectangular diffracting structure.
Figure 9:
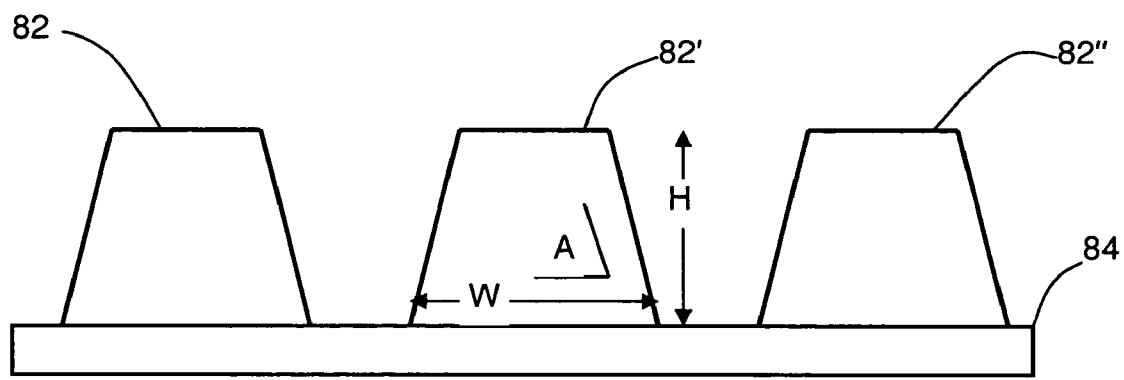
FIG. 9 depicts a cross-section of a non-rectangular diffracting structure.

A wide variety of theoretical model profiles can be used to determine the cross-section area. FIG. 8 depicts the most basic theoretical grating structure, a simple rectangle, wherein W is a measure of width, such as CD, H is a measure of height of diffracting structures 80, 80', 80" posited on substrate 84. The cross-section grating area is defined by the formula:

$$\text{Cross-Section Area} = H \cdot W \tag{1}$$

where H is the grating height and W is the grating width. To improve the accuracy in determining center of stepper focus, more detailed theoretical models may be used. One such model is a trapezoid, which adds the dimension of sidewall angle, as shown in FIG. 9, employing diffracting structures 82, 82', 82". The equation to determine the cross-section of the trapezoidal grating is $$\text{Cross-Section Area} = H \cdot (W - H/\tan A) \quad (2)$$

where H is the grating height, W is the width at the bottom of the grating, and A is the sidewall angle of the trapezoid. Other, more complex shapes may also be used. With more complex shapes more complex equations are needed to express the grating shape in terms of cross-section area.

Three-dimensional structures may also be analyzed in a similar method. For three-dimensional structures one measure of the cross-section is a cross-section volume. For example, a simple contact hole model assuming a perfect circle profile in X-axis and Y-axis and a constant sidewall at 90 degrees along the Z-axis may have its cross-section calculated as a cylinder, thereby yielding a cross-section volume.

Underlying thin film thickness and optical properties of the materials generally will not result in substantial variation in the theoretical library models across focus. However, depending on the choice of scatterometer, configuration and theoretical model, changes in focus may result in changes in these properties. It may thus readily be seen that the theoretical library may incorporate thin film thickness and optical constants in the determined cross-section. This may be as simple as adding the thin film thickness cross-section over an equivalent periodicity to the grating cross-section area, or may be more complicated, such as weighting the contribution of the grating and thin film cross-section areas by the material optical n & K constants.

It may further be seen that non-geometric cross-sections may be employed. Thus, the cross-section may be the product of one parameter, such as CD, and one or more additional parameters, such as for example materials parameters, weighted or average values, angular measures, optical properties, curvatures, or the like. The resulting products may be employed in similar fashion to cross-section areas or volumes.

There are a wide number of ways to analyze the cross-section focus metric to determine center of focus for a lithography device such as a wafer stepper. The most simplistic method is to plot the cross-section, such as cross-section area or volume, as a function of focus, remove any existing outliers, and fit a parabolic curve to the data. The point where the slope is zero is the center of focus, as shown in FIG. 7. Another metric is to simply look for the maximum or minimum cross-section area along focus (depending on whether center of focus is at the maximum or minimum cross-section area, respectively).

Another method of determining the center of focus is to analyze the rate of change in cross-section from one focus step to the next. In the ideal theoretical case, as the focus gets closer to the center of focus, the differences in cross-section from one focus step to the next will decrease, until the change in cross-section from one focus step to the next reaches a minima at the center of focus. The differences in cross-section from one focus step to the next can also be plotted against focus and fitted to a parabolic curve. The point where the slope is zero is the center of focus.

Figure 4:
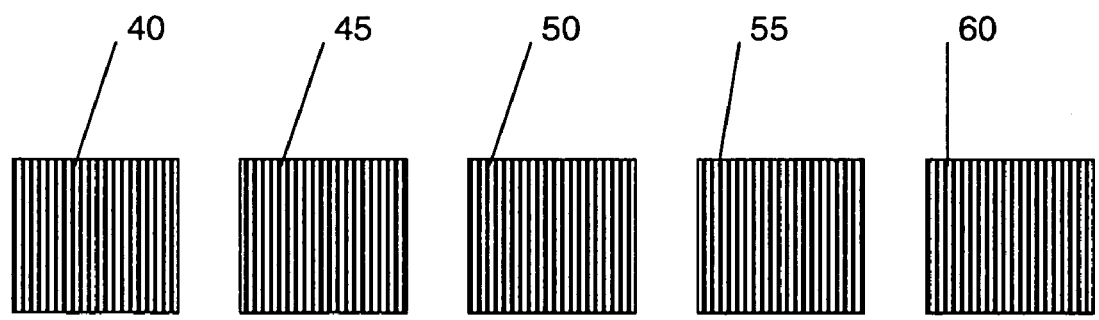
FIG. 4 depicts a series of diffraction gratings.

In addition to determining the best focus position for a stepper or scanner, the focus curves so generated by the methods of this invention can be employed with special stepper/scanner reticles to determine stage tilts and field non-uniformity. In this method a series of diffraction structures, such as diffraction gratings, is employed at the same focus across an area, such as a wafer. In one embodiment, diffraction signatures are obtained from a series of sequential same focus setting diffraction gratings 40, 45, 50, 55, and 60 as shown in FIG. 4. Theoretical profile models and diffraction signatures are determined from a theoretical library and a cross-section, such as a cross-sectional area, determined as a function of the selected diffraction signature and model for each diffraction grating. The resulting cross-sections, such as cross-section areas, are plotted as a function of position, yielding a three-dimensional plot of stage tilt and other field non-uniformity.

It is thus readily apparent that utilizing the cross-section difference and data as to the location of the diffraction structure in the field, which field may conventionally be a wafer stage, that the center of focus as a function of position in the field may be plotted. Such plot may reveal aberrations in the lens system, astigmatism, or other defects causing the center of focus over the field to be non-uniform. Similarly, tilt in the field over both the x- and y-axes may be plotted, thereby showing the stage tilt effects of the center of focus as a function of position in the field.

The methods and devices of this invention may also be used for quality control testing, including analysis of the center of focus determined by other means. This may be done in conjunction with an angle-resolved scatterometer, described above, including its associated computer system, or with other suitable devices capable of making the described measurements.

By means of employing an angle-resolved scatterometer, the diffraction signature is separated into distinct diffraction orders at angular locations specified by the grating equation:

$$\sin \Theta_i + \sin \Theta_n = n\lambda/d \quad (3)$$

where $\Theta_i$ is the angle of incidence, taken as negative, $\Theta_n$ is the angular location of the nth diffraction order, $\lambda$ is the wavelength of incident light and d is the spatial period or pitch of the diffraction structure. It can thus be seen that for the $0^{th}$ or specular diffraction order, the angle of incidence is equal to the angular location of the specular diffraction order. However, diffraction orders other than the specular may be employed, and the appropriate angular location determined as set forth above. Similar relationships govern other modes of generating diffraction signatures, so that with any mode of generating a diffraction signature either the specular diffraction order or some higher diffraction order may be employed. For example, in a wavelength resolve device, the angle $\Theta_i$ may be held constant and the wavelength $\lambda$ varied, and the equation solved for $\Theta_n$ at a given n.

The methods and devices of this invention may also be used for determination of the center of focus, whereby the center of focus is adjusted by any suitable means, including use of computer-based control systems, and the methods of this invention used to determine when an acceptable or optimal focus has been determined. The adjustment may be done by dose variations, or by other means known in the art.

The invention may be further used for automatic or automated determination of the center of focus, utilizing an autofocus control system, whereby information as to the cross-section analysis is used in a control system to determine the focus, such as by dose variations.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of measuring parameters relating to a lithography device comprising the steps of
providing a substrate comprising a plurality of diffraction structures formed on the substrate by lithographic process utilizing the lithography device, the diffraction structures comprising a plurality of spaced elements;
measuring a diffraction signature for at least three of the plurality of diffraction structures by means of a radiation source-based tool;
selecting a theoretical diffraction structure providing a theoretical diffraction signature matching the measured diffraction signature of measured diffraction structures;
calculating a cross-section of each selected theoretical diffraction structure; and
determining a metric between the calculated cross-sections to determine a desired parameter of said lithography device.

2. The method of claim 1, wherein the diffraction structures are single period, bi-periodic or multi-periodic structures.

3. The method of claim 1, wherein the cross-section is a cross-section area.

4. The method of claim 1, wherein the cross-section is a cross-section volume.

5. The method of claim 1, wherein the cross-section is a product of two or more parameters of the theoretical diffraction structure providing the matching theoretical diffraction signature.

6. The method of claim 5, wherein one parameter is CD.

7. The method of claim 1, wherein selecting a theoretical diffraction structure matching the measured diffraction signature of measured diffraction structures comprises generating a theoretical library of theoretical diffraction signatures derived from theoretical diffraction structures.

8. The method of claim 7, further comprising determining a best match theoretical diffraction signature from the theoretical library.

9. The method of claim 1, wherein the metric comprises plotting the calculated cross-sections.

10. The method of claim 1, wherein the metric comprises determining the differences between calculated cross-sections.

11. The method of claim 1, wherein the substrate comprises a wafer.

12. The method of claim 1, wherein the radiation source-based tool comprises a light source-based tool.

13. The method of claim 12, wherein the light source-based tool comprises an incident laser beam source, an optical system focusing the laser beam and scanning through some range of incident angles, and a detector for detecting the resulting diffraction signature over the resulting measurement angles.

14. The method of claim 13, wherein the light source-based tool comprises an angle-resolved scatterometer.

15. The method of claim 12, wherein the light source-based tool comprises a plurality of laser beam sources.

16. The method of claim 12, wherein the light source-based tool comprises an incident broad spectral light source, an optical system focusing the light and illuminating through some range of incident wavelengths, and a detector for detecting the resulting diffraction signature over the resulting measurement wavelengths.

17. The method of claim 12, wherein the light source-based tool comprises an incident light source, components for varying the amplitude and phase of the S and P polarizations, an optical system focusing the light and illuminating over some range of incident phases, and a detector for detecting the phase of the resulting diffraction signature.

18. The method of claim 1, wherein measuring a diffraction signature comprises phase measurement by means of a broad spectral radiation source-based tool source, operating at a fixed angle, a variable angle $\Theta$ or a variable angle $\phi$.

19. The method of claim 1, wherein measuring a diffraction signature comprises phase measurement by means of a single wavelength radiation source-based tool source, operating at a fixed angle, a variable angle $\Theta$ or a variable angle $\phi$.

20. The method of claim 1, wherein measuring a diffraction signature comprises phase measurement by means of a multiple discrete wavelength radiation source-based tool source.

21. The method of claim 1, wherein the diffraction signature is a reflective diffraction signature.

22. The method of claim 1, wherein the diffraction signature is a transmissive diffraction signature.

23. The method of claim 1, wherein the diffraction signature is a specular order diffraction signature.

24. The method of claim 1, wherein the diffraction signature is a higher order diffraction signature.

25. The method of claim 1, the method further comprising forming the plurality of diffraction structures utilizing the lithography device at known different focus settings, whereby the parameter is the center of focus of the lithography device.

26. The method of claim 25, wherein the metric comprises plotting cross-section as a function of focus, plotting the difference between cross-section of adjacent focus setting diffraction structures as a function of focus, determining the rate of change in cross-section, determining the maximum cross-section, or determining the minimum cross-section.

27. The method of claim 25, wherein the known different focus settings are equal increment different focus settings.

28. The method of claim 25, wherein the known different focus settings are non equal increment different focus settings, and the method further comprises use of a mathematical algorithm to normalize the non-equal increment different focus settings.

29. The method of claim 25, wherein the cross-section or the difference in cross-section between diffraction structures varies as an approximation of a parabolic curve with a slope of zero over the center of focus.

30. The method of claim 1, the method further comprising forming the plurality of diffraction structures utilizing the lithography device at the same focus setting and determining the differences as a function of the location of the diffraction structures on the substrate.

31. The method of claim 1, the method further comprising forming the plurality of diffraction structures at known different focus settings and known different dose settings and determining the effect of dose on focus.

32. The method of claim 31, wherein the plurality of diffraction structures comprise sets of the same known different focus setting diffraction structures, the sets varying by different known dose settings.

33. A method of determining the center of focus in a lithography device, comprising the steps of
providing a substrate comprising a plurality of diffraction structures made utilizing the lithography device, the plurality of diffraction structures comprising different known focus settings;
measuring a diffraction signature for at least three of the plurality of diffraction structures by means of a radiation source-based tool;
providing a theoretical library of theoretical diffraction signature of theoretical diffraction structures;

determining a best match theoretical diffraction signature to each measured diffraction signature;

calculating a cross-section for each theoretical diffraction structure providing a best match theoretical diffraction signature; and determining the center of focus as the focus setting wherein there is a minimal difference between the cross-section of adjacent focus setting diffraction gratings.

34. The method of claim 33, wherein the difference in cross-section between adjacent focus setting diffraction structures varies as an approximation of a parabolic curve with a slope of zero on the minimal difference.

35. The method of claim 33, wherein determining the minimal difference comprises fitting data derived from differences between cross-sections between adjacent sequential focus setting diffraction gratings to a parabolic curve, whereby the minimal difference encompasses the minima of the parabolic curve.

36. The method of claim 33, wherein the cross-section of different focus setting diffraction structures is plotted as a function of focus.

37. The method of claim 33, wherein the diffraction structures are single period, bi-periodic or multi-periodic structures.

38. The method of claim 33, wherein the cross-section is a cross-section area.

39. The method of claim 33, wherein the cross-section is a cross-section volume.

40. The method of claim 33, wherein the cross-section is a product of two or more parameters of the theoretical diffraction structure providing the matching theoretical diffraction signature.

41. The method of claim 40, wherein one parameter is CD.

42. The method of claim 33 wherein the substrate comprises a wafer.

43. The method of claim 33, wherein the radiation source-based tool comprises a light source-based tool.

44. The method of claim 43, wherein the light source-based tool comprises an incident laser beam source, an optical system focusing the laser beam and scanning through some range of incident angles, and a detector for detecting the resulting diffraction signature over the resulting measurement angles.

45. The method of claim 44, wherein the light source-based tool comprises an angle-resolved scatterometer.

46. The method of claim 43, wherein the light source-based tool comprises a plurality of laser beam sources.

47. The method of claim 43, wherein the light source-based tool comprises an incident broad spectral light source, an optical system focusing the light and illuminating through some range of incident wavelengths, and a detector for detecting the resulting diffraction signature over the resulting measurement wavelengths.

48. The method of claim 43, wherein the light source-based tool comprises an incident light source, components for varying the amplitude and phase of the S and P polarizations, an optical system focusing the light and illuminating over some range of incident phases, and a detector for detecting the phase of the resulting diffraction signature.

49. The method of claim 33, wherein measuring a diffraction signature comprises phase measurement by means of a broad spectral radiation source-based tool source, operating at a fixed angle, a variable angle Θ or a variable angle φ.

50. The method of claim 33, wherein measuring a diffraction signature comprises phase measurement by means of a single wavelength radiation source-based tool source, operating at a fixed angle, a variable angle Θ or a variable angle φ.

51. The method of claim 33, wherein measuring a diffraction signature comprises phase measurement by means of a multiple discrete wavelength radiation source-based tool source.

52. The method of claim 33, wherein the diffraction signature is a reflective diffraction signature.

53. The method of claim 33, wherein the diffraction signature is a transmissive diffraction signature.

54. The method of claim 33, wherein the diffraction signature is a specular order diffraction signature.

55. The method of claim 33, wherein the diffraction signature is a higher order diffraction signature.

56. The method of claim 33, wherein the different focus settings comprise a constant difference between sequential different focus settings.

57. The method of claim 33, wherein the different known focus settings are non-equal increment different focus settings, and the method further comprises use of a mathematical algorithm to normalize the non-equal increment different focus settings.

58. The method of claim 33, wherein the diffraction structures are latent image diffraction structures.

59. The method of claim 33, wherein the substrate is wafer, wherein the wafer has not been subjected to a development process.

60. A method of process control for center of focus in a lithography device, comprising the steps of providing a substrate comprising a plurality of latent image diffraction structures made utilizing the lithography device, the plurality of diffraction structures comprising different known focus settings;

measuring a diffraction signature for at least three of the plurality of latent image diffraction structures by means of a radiation source-based tool;

providing a theoretical library of theoretical diffraction signatures of theoretical diffraction structures;

determining a best match theoretical diffraction signature to each measured diffraction signature;

calculating a cross-section for each theoretical diffraction structure providing a best match theoretical diffraction signature;

determining the center of focus as the focus setting wherein there is a minimal difference between the cross-section of adjacent focus setting latent image diffraction structures; and adjusting the focus setting of the lithography device to the determined center of focus.

61. The method of claim 60 wherein adjusting the focus setting of the lithography device comprises a computer-based control system.

62. The method of claim 60 wherein adjusting the focus setting of the lithography device comprises an autofocus control system, wherein at least one input to the autofocus control system comprises a parameter relating to the differences between the cross-sections.

* * * * *